United States Patent [19]
Pickles et al.

[11] Patent Number: 5,766,021
[45] Date of Patent: Jun. 16, 1998

[54] BGA INTERCONNECTORS

[75] Inventors: Charles S. Pickles, York, Pa.; David R. Crotzer, Nashua, N.H.

[73] Assignee: Augat Inc., Mansfield, Mass.

[21] Appl. No.: 725,341

[22] Filed: Oct. 1, 1996

[51] Int. Cl.⁶ .................................................. H01R 9/09
[52] U.S. Cl. .......................................... 439/70; 439/264
[58] Field of Search ............................ 439/70, 71, 263, 439/264

[56] References Cited

U.S. PATENT DOCUMENTS

| | | | |
|---|---|---|---|
| 5,355,283 | 10/1994 | Marrs et al. | 361/760 |
| 5,392,980 | 2/1995 | Swamy et al. | 228/119 |
| 5,400,220 | 3/1995 | Swamy | 361/760 |
| 5,419,710 | 5/1995 | Pfaff | 439/71 |
| 5,465,152 | 11/1995 | Bilodeau et al. | 356/371 |
| 5,473,814 | 12/1995 | White | 29/840 |
| 5,492,223 | 2/1996 | Boardman et al. | 206/710 |
| 5,500,605 | 3/1996 | Chang | 324/758 |
| 5,562,462 | 10/1996 | Matsuba et al. | 439/70 |
| 5,637,008 | 6/1997 | Kozel | 439/342 |

OTHER PUBLICATIONS

Aries Electronics, Inc., "*Ball Grid Array Evaluation Kit with 255 Position BallNest™Socket*", Rev A, data sheet, not dated, one sheet.

Aries Electronics, Inc., "*BallNest™ BGA Socket with 16×16 Grid*", Rev B, data sheet, not dated, one sheet.

*Primary Examiner*—Neil Abrams
*Assistant Examiner*—T. C. Patel
*Attorney, Agent, or Firm*—Weingarten, Schurgin, Gagnebin & Hayes LLP

[57] ABSTRACT

A reusable socket adapted for use in making an electrical connection between an integrated circuit of a ball grid array (BGA) type package and a circuit board or test fixture. In one embodiment, the socket includes a return member for reshaping the socket. In a further embodiment, a socket assembly includes a plurality of spaced sockets. In an alternative embodiment, a socket assembly further includes a base member. In another embodiment, a socket is formed from a temperature dependent smart memory material. In a further embodiment, a socket assembly includes a plurality of sockets formed from a shape memory material. In an alternative embodiment, a zero insertion force (ZIF) or a low insertion force (LIF) socket assembly for a BGA package includes a plurality of sockets and a lever adapted for frictionally engaging respective BGA contact balls.

3 Claims, 5 Drawing Sheets

BGA INTERCONNECTORS

BACKGROUND OF THE INVENTION

Many different packages are available for semiconductor devices today. One package type presently gaining in popularity is known as the ball grid array (BGA) package. A BGA package includes a carrier containing a semiconductor die and having a plurality of spaced apart contact balls adapted for electrical connection with a printed circuit board or other mounting surface. BGA package benefits include compact size, superior signal integrity, and low profile. By contrast with a quad flat package and other surface mount devices, a BGA package does not require a fine lead pitch that is necessary where leads are disposed only about the perimeter of a package. Thus, the BGA package is not subject to the demanding tolerance requirements associated with such fine lead pitch packages.

One method of connecting a BGA package to a printed circuit board includes the use of a socket adapted for receiving a BGA contact ball. The socket accepts a contact ball that is within dimensional tolerances as set forth in industry standards. However, the socket can only be used once since the elastic range of the socket is not sufficient to cover the full dimensional range permissible under industry standards. Thus, permanent deformation of the socket may occur after receiving a contact ball having a diameter approaching the upper limits of the standard. This deformation prevents a secure connection being made with a contact ball of a subsequent BGA package. Therefore, a socket for a BGA package is desired in which the socket may be re-used.

BRIEF SUMMARY OF THE INVENTION

The present invention overcomes the aforesaid and other disadvantages of known BGA sockets by providing a reusable socket adapted for use with BGA type packages.

In an exemplary embodiment, a socket according to the invention includes a first member having a first end adapted for receiving a ball grid array contact ball, and a second end adapted for connection to a circuit board or test fixture or other apparatus. The first end of the first member has an engaged or closed position wherein a contact ball is retained within the first end and an unengaged or open position in which the contact ball can be freely inserted and removed. A second member surrounds a portion of the first member and is operative to move the first member first end from the engaged position to the unengaged position thereby reshaping and reforming the first end which may have been deformed by prior insertion of the contact ball. The sockets embodying the invention are usually arranged in an array configured to receive a BGA package thus forming a socket assembly. In a further embodiment, a socket assembly comprises a plurality of spaced sockets fixed in a base member.

In another embodiment, a socket for receiving a BGA contact ball is formed from a shape memory metal. The socket includes a receiving portion having a plurality of spaced fingers operative to receive a contact ball. The fingers define a first or closed position wherein the fingers arcuately conform to a contact ball shape, and a second or open position wherein the fingers are substantially straight for easy insertion of a BGA contact ball. Heat applied to the fingers causes the fingers to move from the first position to the second position. In a further embodiment, a socket assembly adapted for use with a BGA package includes a plurality of spaced sockets formed from a shape memory metal.

In an alternative embodiment, a BGA socket assembly includes a plurality of spaced sockets fixed in a base member and a rigid member defining a plurality of apertures, and a lever. Each of the plurality of apertures corresponds to one of the plurality of sockets. Each of the plurality of sockets include a receiving portion having a plurality of spaced fingers operative with the rigid member to frictionally engage a corresponding contact ball under the control of the lever. Thus, a low or zero insertion force socket assembly or connector for a BGA package is formed.

BRIEF DESCRIPTION OF THE SEVERAL VIEWS OF THE DRAWING

Other features and advantages of the invention will be apparent from the following detailed description of the invention in conjunction with the accompanying drawings, in which.

DETAILED DESCRIPTION OF THE INVENTION

Figure 3:
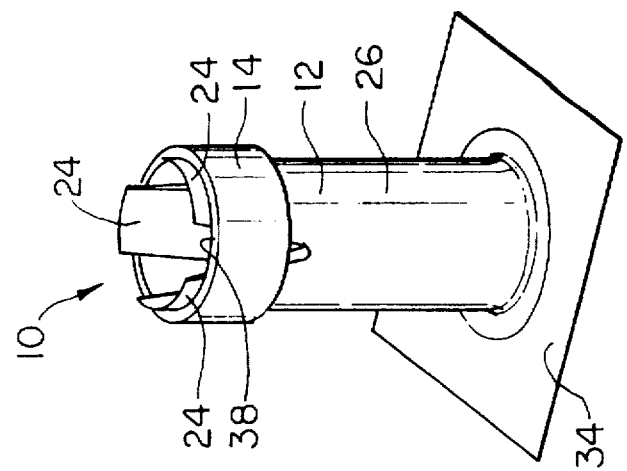
FIG. 3 is a perspective view of the socket of FIG. 1 shown in the unengaged position and showing the return member in a second position.
Figure 2:
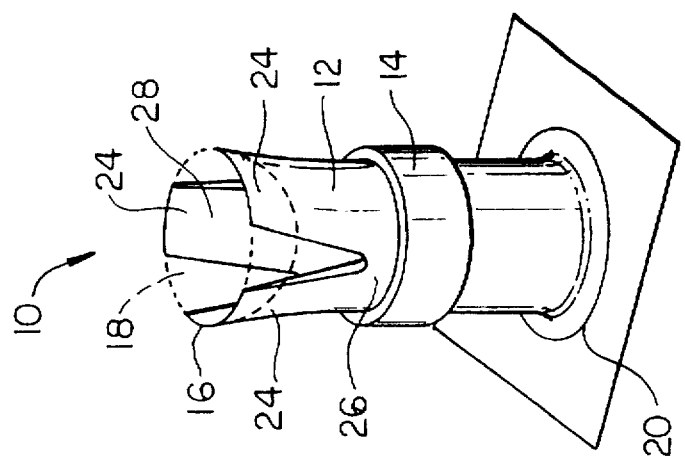
FIG. 2 is a perspective view of the socket of FIG. 1, shown in an engaged position including a return member in a first position.
Figure 1:
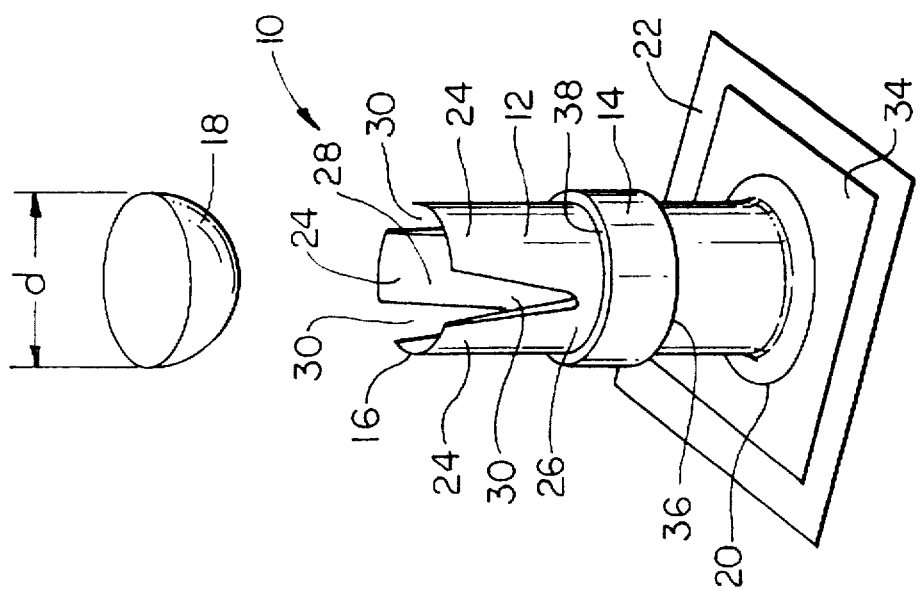
FIG. 1 is a perspective view of a first embodiment of a reusable BGA socket according to the present invention shown in an unengaged position.

FIGS. 1–3 illustrate a reusable socket adapted for use with an integrated circuit or other device or package of the ball grid array (BGA) type wherein an electrical connection is made between a contact ball of a BGA package and a circuit board.

In an exemplary embodiment, a socket 10 includes a connection member 12 and a return member 14. The connection member 12 includes a first end 16 adapted for receiving a BGA contact ball 18 and a second end 20 adapted for connection to a circuit board 22. The connection member first end 16 includes contact fingers or spring members 24 extending from a base portion 26 which define a region 28 adapted for receiving the BGA contact ball 18. The contact fingers 24 are separated by gaps 30 which allow the contact fingers to move outward as the contact ball 18 is inserted. In an exemplary embodiment, the connection member second end 20 is secured to a solder pad 34 disposed on the circuit board 22. It will be appreciated that the socket can be used to make a connection to a test fixture, as well as a circuit board, or to any other electrical device or apparatus to which electrical connection is desired.

The connection member contact fingers 24 are movable between an unengaged position and an engaged position. In the unengaged position, the contact fingers are ready to accept a contact ball 18. In the engaged position, the contact fingers 24 engagedly surround the contact ball 18 located within the region 28, to form an electrical connection between the BGA contact ball and the socket 10. In an illustrative embodiment, the socket 10 is adapted for receiving a contact ball having a nominal size of about 0.030 inches in diameter and ranging from a minimum of 0.024 to a maximum of 0.035 inches. Contact balls with the dimensional ranges are considered conforming. In one embodiment, the contact balls are spaced 0.05 inches apart. However, other sizes and ranges and spacings for contact balls and corresponding sockets are contemplated.

In an exemplary embodiment, the return member 14 is ring or collar shaped and surrounds a portion of the base portion 26 of the connection member 12. The return member 14 is axially movable about the connection member 12 between a first position and a second position. In the first position, a first end 36 of the return member 14 rests on the solder pad 34 and in the second position a second end 38 of the return member is proximate ends of the contact fingers 24. One or more of the contact fingers can include a protrusion proximate ends of the contact fingers to limit travel of the return member.

In operation, an electrical connection is formed between the BGA contact ball 18 and the circuit board 22 via the socket 10 by inserting the contact ball into the region 28 wherein the contact fingers 24 impinge upon the contact ball. This causes the contact fingers 24 to deform moving the contact fingers from the unengaged position to the engaged position. However, if a relatively large, although conforming, contact ball is inserted within the region 28, the elastic range of the contact fingers 24 may be exceeded. Thus, after a relatively large contact ball is removed from the socket 10, the contact fingers 24 may not deflect completely back to the unengaged position and the socket can not make a subsequent electrical connection with a relatively small, although conforming, contact ball.

As shown in FIG. 3, in order to allow the socket 10 to be reused, the return member 14 is moved from the first position to the second position to remove plastic deformation of the contact fingers 24. In this manner, the contact fingers 24 are returned to the unengaged position and the socket 10 is ready to accept a contact ball of a subsequent BGA package.

The connection member 12 is formed from a conductive metal or metal alloy, such as phosphor bronze, in an exemplary embodiment, but other materials having suitable conductivity and elastic deformation properties may be employed as known to one skilled in the art. The socket 10, and in particular the contact fingers 24, can also be coated with materials such as gold and nickel, to improve the electrical contact between the connection member 12 and the contact ball 18 as is known in the art. The return member 14 is formed from steel in a preferred embodiment, but other materials such as polytetrafluoroethylene (PTFE) or plastics known to one skilled in the art can be used. The small contact fingers 24 and low socket height provide a short connection length which is an advantage as signal rise and fall times decrease and bandwidth increases as is known to one skilled in the art.

Figure 4:
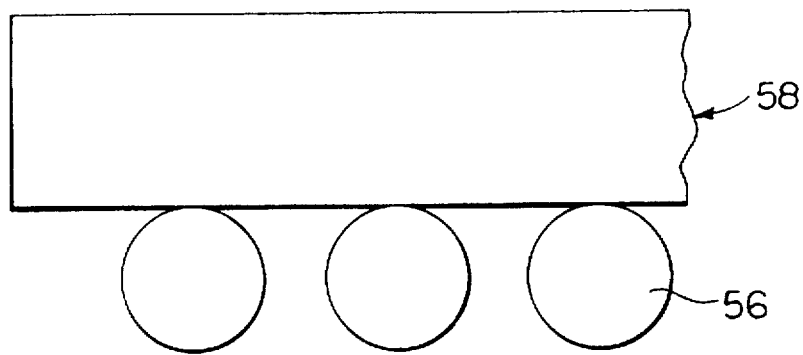
FIG. 4 is a side view of a prior art BGA package.
Figure 5:
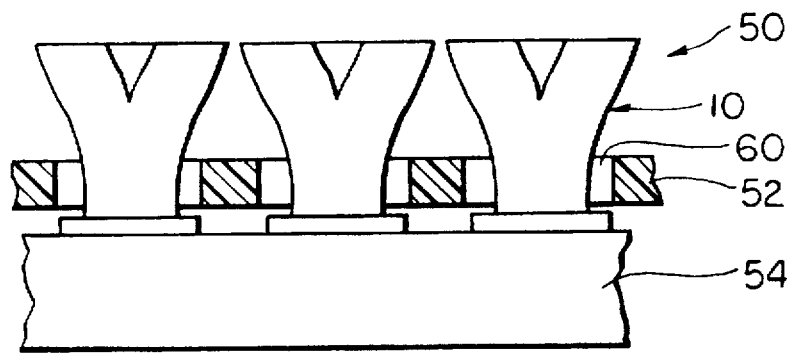
FIG. 5 is a cross sectional view of another embodiment of a socket assembly including a rigid member in a first position according to the present invention.
Figure 6:
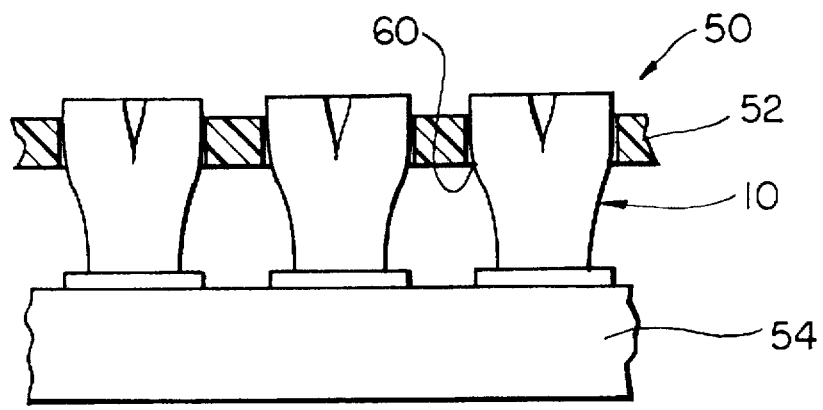
FIG. 6 is a cross sectional view of the socket assembly of FIG. 5 showing the rigid member in a second position.

In an exemplary embodiment as shown in FIGS. 4–6, a socket assembly 50 includes a plurality of the sockets 10 described above in conjunction with FIGS. 1–3 and a substantially rigid member 52. The sockets 10 are affixed to a circuit board 54 wherein each of the plurality of sockets corresponds to a solder or contact ball 56 of a BGA package 58. The rigid member 52 defines a plurality of apertures or return members 60 corresponding to a respective socket. The apertures 60 are sized to reshape a respective socket to remove plastic deformation of the socket. The rigid member 52 is movable between a first position and a second position under the control of a lever (FIGS. 14 and 15) for reshaping the sockets 10.

In operation, after a BGA package 58 is removed from the socket assembly 50, the lever (FIG. 14) is actuated to move the rigid member 52 from the first position to the second position to remove plastic deformation of sockets caused by a relatively large BGA contact ball. The socket assembly 50 provides a way to rapidly resize each of the sockets 10 after a BGA package has been removed from the socket assembly thereby removing plastic deformation of any individual socket. Thus, the sockets are prepared for receiving the contact balls of a subsequent BGA package. The socket assembly is useful in test environments and prototype situations.

Figure 7:
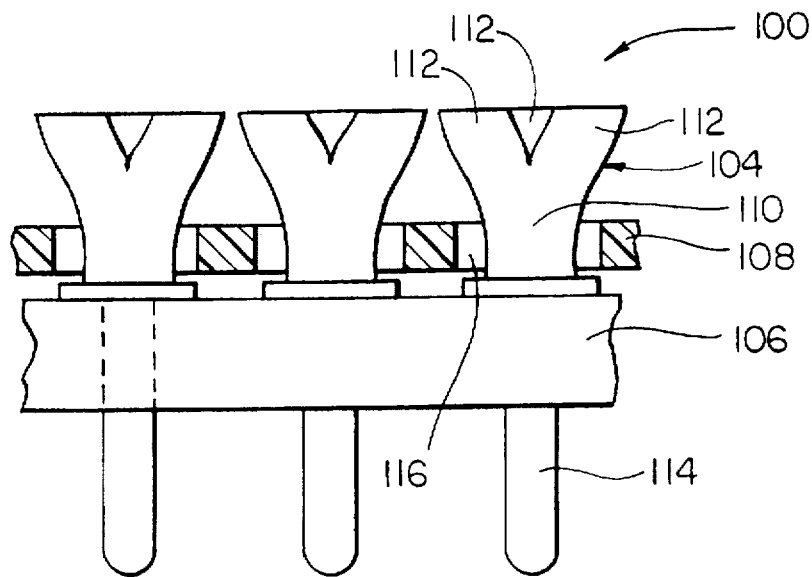
FIG. 7 is a cross sectional view of a further embodiment of a socket assembly according to the present invention further showing a rigid member in a first position.
Figure 8:
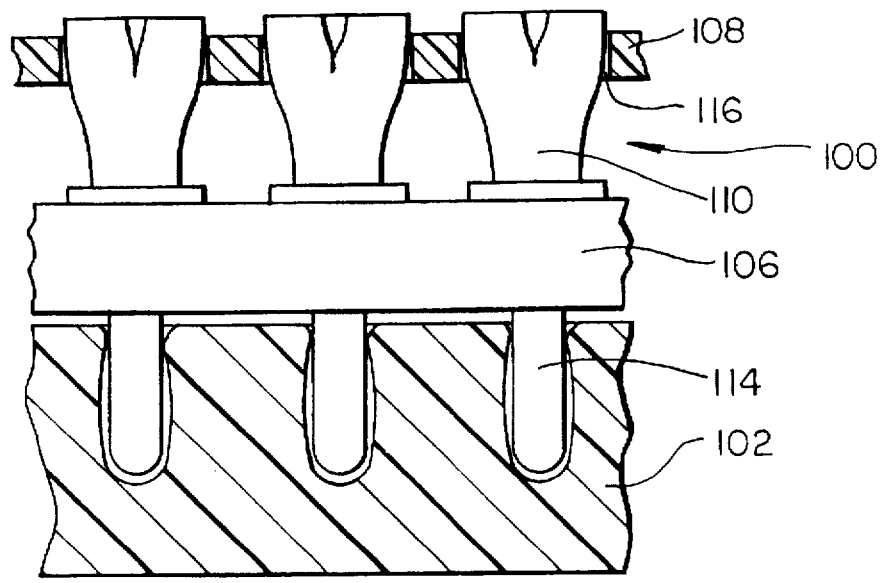
FIG. 8 is a cross sectional view of the socket assembly of FIG. 7 showing the rigid member in a second position.
Figure 14:
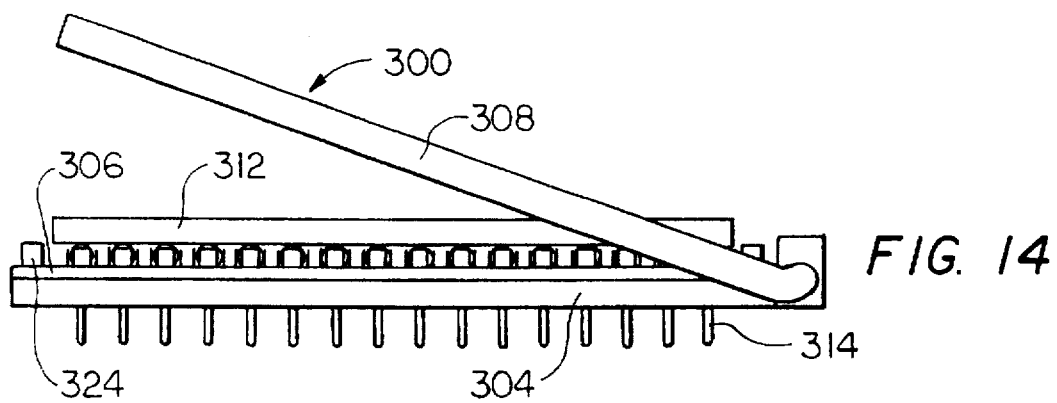
FIG. 14 is a side view of the socket assembly of FIG. 12 showing a lever in a first position.
Figure 15:
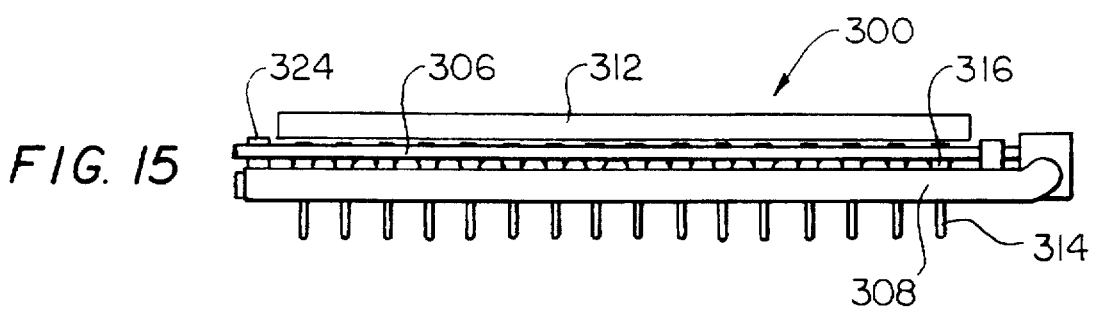
FIG. 15 is a side view of the socket assembly of FIG. 12 showing the lever in a second position.

In another embodiment shown in FIGS. 7–8, a socket assembly 100 for receiving a BGA package and adapted for insertion into a circuit board 102 includes a plurality of spaced sockets 104 fixed in a base member 106, and a substantially rigid member 108 for reshaping the sockets. Each of the plurality of sockets 104 include a receiving portion 110 having a plurality of spaced fingers 112 and a pin portion 114, a part of which extends through the base member 106 for insertion into the circuit board 102. The receiving portion 110 defines an unengaged position prior to insertion of a contact ball and an engaged position as a contact ball is grasped by the fingers 112 of the receiving portion 110. The rigid member 108 defines a plurality of apertures or return members 116 corresponding to each of the sockets 104 having a size substantially conforming to the socket receiving portion 110 in the unengaged position. The rigid member 108 is movable between a lowered position and a raised position under the control of a lever (FIGS. 14 and 15). In an illustrative embodiment, the socket assembly pin portions 114 conform to a Pin Grid Array (PGA) footprint. It is understood that in other embodiments, the socket assembly fits into other configurations such as surface mount, or other package footprints known in the art.

In operation, a first BGA package is inserted into and then removed from the socket assembly 100 thereby causing plastic deformation of some of the socket fingers 112 by larger socket balls of the BGA package so that the some socket receiving portions 110 do not return to the unengaged position. The lever (FIG. 14) is moved from an up position to a down position causing the rigid member 108 to move from the lowered position to the raised position. As the rigid member 108 moves to the raised position, each of the apertures 116 reshapes the fingers 112 of the corresponding socket 104 to the unengaged position thus removing plastic deformation of the socket. The sockets 104 in the socket assembly 100 are ready to make a secure electrical connection with the contact balls of a subsequent BGA package.

Figure 9:
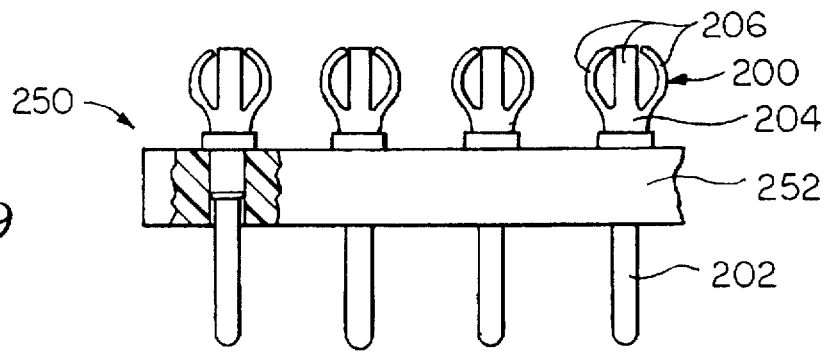
FIG. 9 is a side view of a another embodiment of a socket assembly according to the present invention showing sockets in a first position.
Figure 9A:
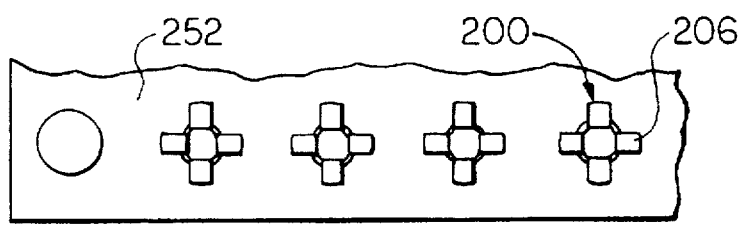
FIG. 9A is a top view of the socket assembly of FIG. 9.
Figure 10:
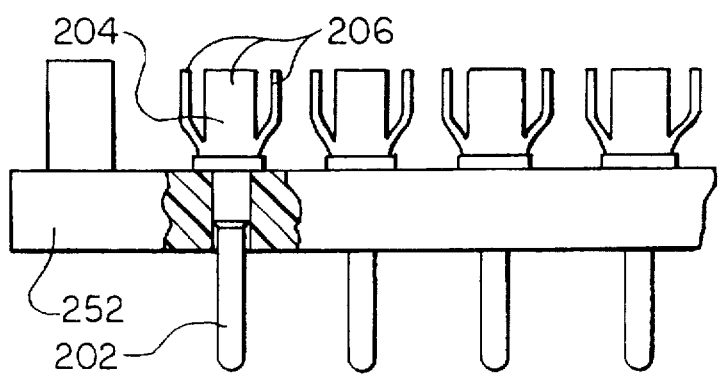
FIG. 10 is a side view of the socket assembly of FIG. 9 showing the sockets in a second position.
Figure 11:
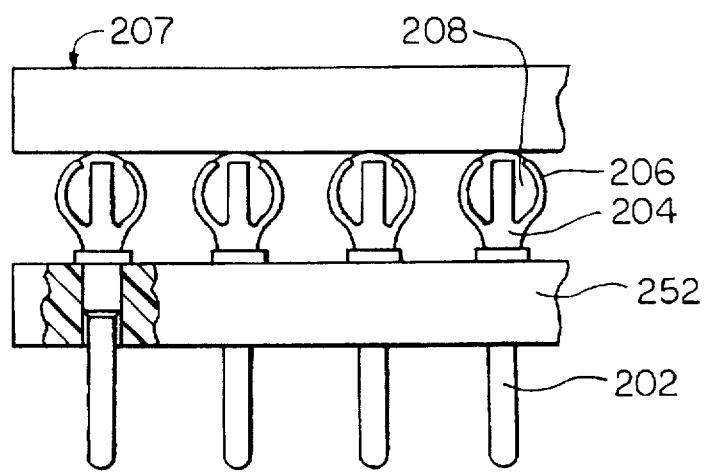
FIG. 11 is a side view of the socket assembly of FIG. 9 showing the sockets in the first position after insertion of a BGA package.
Figure 12:
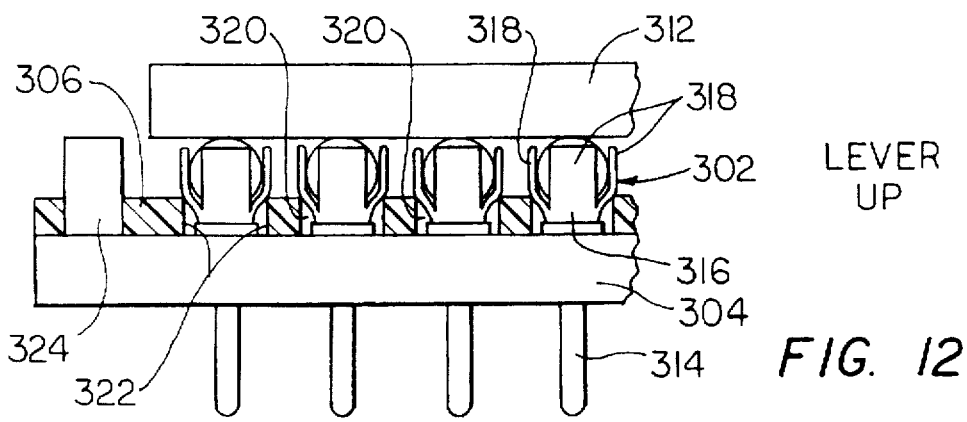
FIG. 12 is a cross sectional view of a further embodiment of a socket assembly according to the present invention showing a rigid member in a first position.
Figure 13:
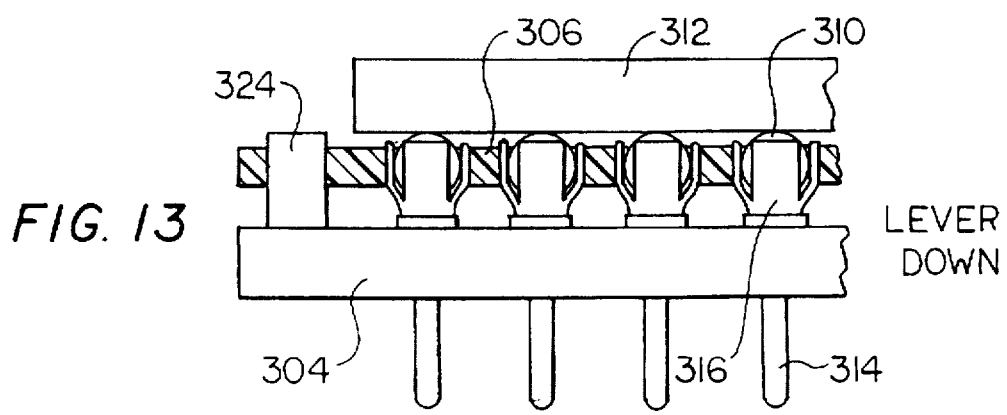
FIG. 13 is a cross sectional view of the socket assembly of FIG. 12 showing the rigid member in a second position.

In a further embodiment shown in FIGS. 9–11, a socket 200 includes a pin portion 202 and a receiving portion 204 extending therefrom having a plurality of spaced fingers 206. The fingers 206 are formed from a shape memory material such as a Cu-Zn-Al alloy. Shape memory materials change shape with temperature variations as is known in the art. The pin portion 202 may also be formed from a shape memory metal or other conductive material. In an exemplary embodiment, the fingers 206 are plated with nickel and gold for improved electrical connection as is known to one skilled in the art. In an alternative embodiment, socket fingers are formed from a Ni-Ti alloy (Nitinol).

In order to place a BGA package 207 contact ball 208 in the socket 200, the socket is heated causing the fingers 206 to move from a first position wherein the fingers substantially conform to a BGA contact ball 208 to a second position wherein the fingers are substantially straight. Shortly after removing the heat, the BGA contact ball 208 is placed within the socket fingers 206. As the fingers 206 cool, the fingers migrate toward the original shape or first position thereby surrounding the contact ball 208 and making a secure electrical connection. The temperature applied to the fingers 206 is of course less than the melting point of the contact ball formed from solder. To remove the inserted BGA contact ball, heat is applied to the fingers 206 causing the fingers to spread allowing easy removal of the contact ball.

In an exemplary embodiment, a socket assembly 250 includes a plurality of spaced sockets 200 formed from a shape memory metal affixed in a base member 252 in a spaced relationship for receiving contact balls 208 of a BGA package 207. Each of the plurality of sockets 200 include a pin portion 202 a part of which extends through the base member 252, and a receiving portion 204 extending from the pin portion and having a plurality of spaced fingers 206. Heat is applied to the sockets 200 to move the socket fingers from a first position to a second position for easy insertion of a BGA package 207 into the socket assembly 250. Alternatively, the socket pin portions can be connected directly with a circuit board without the base member. A low or zero insertion force (LIF or ZIF) connector for a BGA package if thus formed.

In another embodiment shown in FIGS. 12–15, a socket assembly 300 includes a plurality of spaced sockets 302 affixed in a base member 304, and a substantially rigid member 306 movable between a first position and a second position under the control of a lever 308. In an exemplary embodiment, the sockets 302 correspond to the contact balls 310 of a BGA package 312. Each of the sockets 302 include a pin portion 314 and a receiving portion 316 extending therefrom having a plurality of spaced fingers 318. The rigid member 306 defines a plurality of apertures 320 corresponding to a respective socket 302 each defining an inner surface 322. The apertures 320 are sized to capture a contact ball within the socket fingers 318.

In operation, a BGA package 312 is placed within the socket assembly 300 wherein each BGA contact ball 310 is inserted into a corresponding socket 302. The lever 308 is moved from the up position to the down position thereby moving the rigid member 306 from the first position to the second position. As the rigid member 306 moves to the second position, the inner surfaces 322 of the apertures impinge on the fingers 318 causing frictional engagement of the fingers and a respective contact ball 310. In an illustrative embodiment, at least one guide member 324 is affixed to the base member 304 for preventing lateral movement of the rigid member 306 during movement between the first and second positions. Thus a low or zero insertion force (LIF or ZIF) socket assembly or connector for a BGA package is provided.

The described sockets are shown in exemplary embodiments having three and four contact fingers, but other configurations are possible to provide the required electrical connection between the socket and the contact ball. For example, less or more than three or four contact fingers may be used. Additionally, other deformable spring type configurations may be used that are known to one skilled in the art. Further, other means can be used in place of the disclosed lever without departing from the invention.

Although the invention has been shown and described with respect to exemplary embodiments thereof, various other changes, omissions, and additions in form and detail thereof may be made therein without departing from the spirit and scope of the invention.

What is claimed is:

1. A socket assembly for a BGA package having a plurality of spaced contact balls, comprising:

a plurality of spaced elongated sockets each including a pin portion and a receiving portion extending therefrom, said receiving portion including a plurality of spaced fingers, all of the sockets being similarly oriented in the same axial direction and arrayed in a plane perpendicular thereto;

a planar base member having at least a part of each of said pin portion disposed therein;

a substantially rigid member adjacent said base member defining a plurality of co-planar apertures, wherein each of said plurality of apertures corresponds to one of said plurality of sockets, said rigid member movable between a first axial position in which each aperture is adjacent said receiving portion of said corresponding socket such that when said BGA package is retained by said socket assembly said contact balls are frictionally engaged with respective ones of said plurality of fingers for making an electrical connection between a respective contact ball and socket, and a second axial position in which each aperture is away from said receiving portion of said corresponding socket such that said contact balls of said BGA package are insertable in respective ones of said plurality of sockets.

2. The socket assembly according to claim 1, further including a lever in mechanical communication with said rigid member for moving said rigid member between said first axial position and said second axial position.

3. The socket assembly according to claim 1, further including at least one guide member affixed to said base member for preventing lateral movement of said rigid member.

* * * * *